US011984549B2

(12) United States Patent
Mayer et al.

(10) Patent No.: US 11,984,549 B2
(45) Date of Patent: May 14, 2024

(54) OPTOELECTRONIC DEVICE

(71) Applicant: Aledia, Echirolles (FR)

(72) Inventors: Frédéric Mayer, Voiron (FR); Frédéric Mercier, Saint-Nicolas-de-Macherin (FR); Ivan-Christophe Robin, Grenoble (FR); Xavier Hugon, Teche (FR)

(73) Assignee: Aledia, Echirolles (FR)

( * ) Notice: Subject to any disclaimer, the term of this patent is extended or adjusted under 35 U.S.C. 154(b) by 376 days.

(21) Appl. No.: 17/414,874

(22) PCT Filed: Dec. 19, 2019

(86) PCT No.: PCT/FR2019/053176
§ 371 (c)(1),
(2) Date: Jun. 16, 2021

(87) PCT Pub. No.: WO2020/128341
PCT Pub. Date: Jun. 25, 2020

(65) Prior Publication Data
US 2022/0059743 A1 Feb. 24, 2022

(30) Foreign Application Priority Data
Dec. 21, 2018 (FR) ...................................... 1873944

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 33/005* (2013.01); *H01L 2933/0066* (2013.01)

(58) Field of Classification Search
CPC ... H01L 33/62; H01L 25/0753; H01L 25/167; H01L 2933/0066; H01L 25/16; H01L 25/00; H01L 23/48; H01L 23/00
See application file for complete search history.

(56) References Cited

U.S. PATENT DOCUMENTS 9,793,252 B2    10/2017  Ghosh
2014/0014894 A1*  1/2014  Mohammed .......... H01L 33/647
                                                       257/98
(Continued)

FOREIGN PATENT DOCUMENTS

EP    3 385 990 A1    10/2018
FR       3031238 A1 *  7/2016  ....... G02F 1/133603

OTHER PUBLICATIONS

International Preliminary Report on Patentability for International Application No. PCT/FR2019/053176, mailed Jul. 1, 2021.
(Continued)

*Primary Examiner* — Walter H Swanson
*Assistant Examiner* — Jacob T Nelson
(74) *Attorney, Agent, or Firm* — Wolf, Greenfield & Sacks, P.C.

(57) ABSTRACT

An optoelectronic device including an integrated circuit including light-emitting diodes, thin film transistors, and a stack of electrically-insulating layers, said stack being located between the light-emitting diodes and the transistors, said stack further including conductive elements, between and through said insulating layers, said conductive elements connecting at least some of the transistors to the light-emitting diodes.

14 Claims, 8 Drawing Sheets

(51) Int. Cl.
*H01L 25/16* (2023.01)
*H01L 33/00* (2010.01)

(56) References Cited

U.S. PATENT DOCUMENTS

2017/0358562 A1* 12/2017 Banna ................... H01L 25/50
2018/0233575 A1*  8/2018 Kim ................. H01L 27/14692

OTHER PUBLICATIONS

International Search Report and Written Opinion for International Application No. PCT/FR2019/053176, mailed Mar. 3, 2020.
PCT/FR2019/053176, Jul. 1, 2021, International Preliminary Report on Patentability.
PCT/FR2019/053176, Mar. 3, 2020, International Search Report and Written Opinion.

* cited by examiner

OPTOELECTRONIC DEVICE

This application is a national stage filing under 35 U.S.C. § 371 of International Patent Application Serial No. PCT/FR2019/053176, filed Dec. 19, 2019, which claims priority to French patent application FR18/73944, filed Dec. 21, 2018. The contents of these applications are incorporated herein by reference in their entireties.

TECHNICAL BACKGROUND

The present disclosure generally concerns optoelectronic devices and, more specifically, devices comprising light-emitting diodes.

PRIOR ART

The phrase "optoelectronic devices comprising light-emitting diodes" designates devices capable of converting an electric signal into an electromagnetic radiation, and particularly devices dedicated to emitting an electromagnetic radiation, particularly light.

Generally, the circuits for controlling the light-emitting diodes of such a device comprise insulated gate field-effect transistors, or MOS transistors, formed according to the CMOS technology, for example formed on a wafer different from the wafer having the light-emitting diodes formed thereon. The two wafers are then placed against each other and electrically connected.

The forming of such a structure has a high cost. This is partially due to the connections between the different wafers, which cannot be optimized.

SUMMARY

An embodiment overcomes all or part of the disadvantages of known optoelectronic devices.

An embodiment provides an optoelectronic device comprising an integrated circuit comprising light-emitting diodes, thin film transistors, and a stack of electrically-insulating layers, said stack being located between the light-emitting diodes and the transistors, said stack further comprising conductive elements, between and through said insulating layers, said conductive elements connecting at least some of the transistors to the light-emitting diodes.

According to an embodiment, the light-emitting diodes comprise wire-shaped, conical, or tapered semiconductor elements.

According to an embodiment, each transistor comprises an electrically-conductive block forming the transistor gate, the electrically-conductive blocks being separated from one another by electrically-insulating regions.

According to an embodiment, each transistor comprises a semiconductor block forming the drain, source, and channel areas of the transistor, the semiconductor blocks being separated from one another by electrically-insulating regions.

According to an embodiment, the transistors are distributed in at least two thin-film transistor stages.

According to an embodiment, each stage comprises an insulating layer forming the gate insulator of all the transistors of this stage.

According to an embodiment, for each light-emitting diode, a first end of the light-emitting diode is connected to one of the conductive elements.

According to an embodiment, for at least one of the transistors, the source and drain regions and the gate of the transistor are located in a same insulating layer.

Another embodiment provides a method of manufacturing an optoelectronic device, comprising the forming of an integrated circuit comprising the steps of: a) forming light-emitting diodes; b) forming a stack of electrically-insulating layers, said stack further comprising conductive elements between and through said insulating layers; and c) forming thin film transistors, said stack being located between the light-emitting diodes and the transistors, said conductive elements connecting at least some of the transistors to the light-emitting diodes.

According to an embodiment, step a) comprises forming wire-shaped, conical, or tapered semiconductor elements.

According to an embodiment, step a) comprises growing semiconductor elements of the light-emitting diodes on conductive or semiconductor seed pads.

According to an embodiment, the method comprises a step of removing the seed pads.

According to an embodiment, step c) comprises forming thin film transistors distributed on at least two stages.

According to an embodiment, steps b) and c) are carried out at temperatures lower than 150° C.

The foregoing and other features and advantages will be discussed in detail in the following non-limiting description of specific embodiments in connection with the accompanying drawings.

DESCRIPTION OF THE EMBODIMENTS

Figure 1:
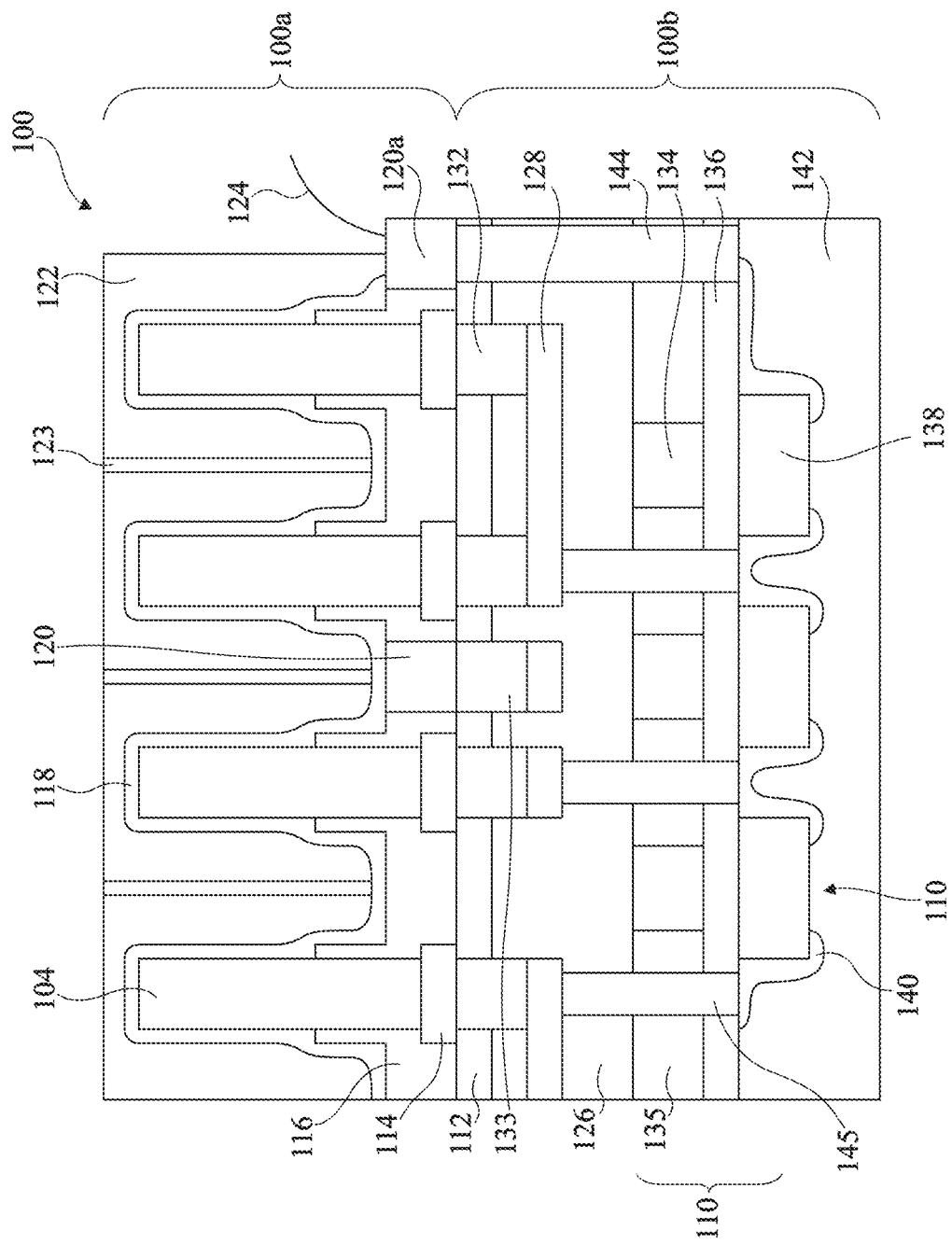
FIG. 1 is a partial simplified cross-section view of an embodiment of an optoelectronic device.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, electric connections between various conductive portions may be present, without being shown, in the cross-section planes of the drawings or in planes parallel to the cross-section planes of the drawings.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

The concepts of insulation and of conduction are to be respectively understood as electric insulation and electric conduction. The insulating materials and elements are thus electrically insulating, and the conductive materials and elements are thus electrically conductive.

In the following description, embodiments are described for optoelectronic devices comprising three-dimensional light-emitting diodes, that is, each light-emitting diode comprises a wire-shaped, conical, or tapered semiconductor element, for example, a microwire or a nanowire. However, such embodiments may also be implemented for planar light-emitting diodes, that is, for light-emitting diodes formed from a stack of planar semiconductor layers.

The term "microwire" or "nanowire" designates a three-dimensional structure having an elongated shape along a preferred direction, having at least two dimensions, called minor dimensions, in the range from 5 nm to 5 µm, preferably from 50 nm to 2.5 µm, the third dimension, called major dimension, being at least equal to 1 time, preferably at least 5 times, and more preferably still at least 10 times, the largest minor dimension. In certain embodiments, the minor dimensions may be smaller than or equal to approximately 1 µm, preferably in the range from 100 nm to 1 µm, more preferably from 100 nm to 300 nm. In certain embodiments, the height of each microwire or nanowire may be greater than or equal to 500 nm, preferably in the range from 1 µm to 50 µm. The base of the wire for example has an oval, circular, or polygonal shape, particularly triangular, rectangular, square, or hexagonal.

FIG. 1 schematically shows an embodiment of an optoelectronic device 100 and more particularly an integrated circuit of device 100.

Device 100 comprises a first portion 100a comprising the optical components of device 100 and a second portion 100b comprising electronic components capable of controlling the optical components.

First portion 100a comprises:

an insulating seed layer 112;

conductive or semiconductor seed pads 114, at least partially resting on layer 112, layer 112 being made of a material favoring the growth of pads 114;

light-emitting diodes 104, four light-emitting diodes being shown in FIG. 1. Each light-emitting diode 104 rests on a conductive pad 114, each pad 114 being in contact with one end of the associated light-emitting diode 104. Conductive pads 114 are made of a material favoring the growth of conductive elements of light-emitting diodes 104;

an insulating layer 116, covering insulating layer 112, and a portion of each pad 114 and a lower portion of each light-emitting diode 104;

conductive pads 120 located between certain light-emitting diodes 104 in layer 116;

a conductive layer 118, transparent to the radiations emitted by light-emitting diodes 104, covering the upper portions of light-emitting diodes 104 and insulating layer 116. Conductive layer 118 is in contact with a second end of each light-emitting diode 104 and with conductive pads 120. Layer 118 thus forms an electrode common to all the light-emitting diodes 104; and blocks 122 covering conductive layer 118 and each surrounding at least one light-emitting diode 104, four blocks 122, each covering a light-emitting diode, being shown in FIG. 1. Blocks 122 are separated from one another by walls 123. Walls 123 prevent the radiation of each diode from reaching the neighboring blocks 122. Certain blocks 122, for example corresponding to the diodes intended to supply blue radiations outside of blocks 122, may be transparent to the radiations emitted by light-emitting diodes 104. Blocks 122 may have a monolayer or multilayer structure. According to an embodiment, blocks 122 comprise at least one layer deposited by a conformal deposition method. According to an embodiment, blocks 122 comprise at least one first layer deposited by a conformal deposition method and in contact with conductive layer 118, and at least one second layer for filling the spaces between light-emitting diodes to obtain a substantially planar front surface. Each block 122, or at least one of the layers forming it when block 122 has a multilayer structure, may further comprise a photoluminescent material capable, when it is excited by the light emitted by the light-emitting diode(s) covered with the block, of emitting light at a wavelength different from the wavelength of the light emitted by the light-emitting diode(s). Certain conductive pads 120a among conductive pads 120 may be at least partially exposed, a single conductive pad 102a being shown in FIG. 1. Pads 120a may for example be connected by conductive wires 124 to elements external to the integrated circuit, particularly a source of a high reference potential and a source of a low reference potential, for example, the ground or a source of a data signal.

Each light-emitting diode 104 may thus be controlled by a voltage supplied between electrode 118, connected to the second end of the diode, and the pad 114 connected to the first end of the diode.

As a variation, seed layer 112 and/or seed pads 114 may have been removed.

The second portion 100b of device 100 comprises:

a stack 126 of insulating layers, represented in FIG. 1 by a single block 126. Stack 126 is located in contact with the surface of layer 112 opposite to pads 114. Stack 126 further comprises conductive elements 128, for example, conductive tracks and conductive vias, located between and through the insulating layers of stack 126. Conductive elements 128 form an interconnection network. In particular, the conductive vias 132 of the interconnection network cross layer 112 so as to be connected to pads 114, and thus to be coupled to the first ends of light-emitting diodes 104. Preferably, each pad 114 is in contact with a conductive via 132. Further, conductive vias 133 of the interconnection network, a single via 133 being shown, cross layer 112 so as to be connected to conductive pads 120. Thus, pads 120 are interconnected and connected to pads 120a to supply in a plurality of locations a same voltage to conductive layer 118;

transistors 110 located on the side of stack 126 opposite to light-emitting diodes 104, three transistors being shown in FIG. 1. Transistors 110 are thin film transistors (TFT). More specifically, each transistor 110 comprises:

a semiconductor or conductive block 134, forming the gate of transistor 110. The gate of each transistor 110 is connected, by a first surface, to the interconnection network by connections, not shown. Blocks 134 are separated from one another by insulating regions 135;

an insulating layer 136 covering a second surface, opposite to the first surface, of block 134, where insulating layer 136 may be common to all transistors 110; and a semiconductor block 138 located opposite block 134, on the other side of insulating layer 136. Block 138 comprises the source and drain areas of transistor 110. The portion of insulating layer 136 located between block 134 and block 136 forms the gate insulator of transistor 110;

conductive tracks 140 partially extending on semiconductor blocks 138, as well as on insulating layer 136, to connect the source and drain areas of transistors 110 to one another. In the example of FIG. 1, conductive tracks 140 connect the three transistors 110 in series. However, other layouts are possible;

an insulating layer 142 covering conductive tracks 140, insulating layer 136, and semiconductor blocks 138;

conductive vias 144, a single conductive via 144 being shown in FIG. 1, capable of crossing insulating layer 112, the insulating layers of stack 126, and insulating layers 135 and 136 to electrically connect conductive tracks 140 to conductive pads 120 or 120a, other vias 145 crossing insulating layers 126, 135, and 136 so as to electrically connect conductive tracks 140 to the interconnection network; and a support, not shown. The support is for example a handle fixed to layer 142, an electronic chip, or another type of support.

Each light-emitting diode 104 comprises two semiconductor elements, one for example being a three-dimensional element such as previously defined, for example, a wire, and an active layer interposed between the two semiconductor elements.

Seed pads 114, also called seed islands, are made of a material favoring the growth of the wires of light-emitting diodes 104. As an example, the material forming seed pads 114 may be a nitride, a carbide, or a boride of a transition metal from column IV, V, or VI of the periodic table of elements, or a combination of these compounds. As an example, seed pads 114 may be made of aluminum nitride (AlN), of boron (B), of boron nitride (BN), of titanium (Ti), of titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate (ZrB2), of zirconium nitride (ZrN), of silicon carbide (SiC), of tantalum carbonitride (TaCN), of magnesium nitride in $Mg_xN_y$ form, where x is approximately equal to 3 and y is approximately equal to 2, for example, magnesium nitride in Mg3N2 form or magnesium gallium nitride (MgGaN), of tungsten (W), of tungsten nitride (WN), or of a combination thereof.

The insulating materials may be selected from the group comprising silicon oxide (SiO2), silicon oxynitride (SiON), silicon nitride (SiN), aluminum nitride (AlN), titanium oxide (TiO2), aluminum oxide (Al2O3), electrically-insulating organic materials, for example, parylene or ALX resin, and mixtures of at least two of these compounds.

The semiconductor elements of light-emitting diodes 104 are at least partly made of at least one semiconductor material. The semiconductor material may be silicon, germanium, silicon carbide, a III-V compound, a II-VI compound, or a combination of these compounds.

The semiconductor elements may be at least partly made of semiconductor materials mainly comprising a III-V compound, for example, III-N compounds. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

The semiconductor elements may be at least partly formed based on semiconductor materials mainly comprising a II-VI compound. Examples of group-II elements comprise group-IIA elements, particularly beryllium (Be) and magnesium (Mg), and group-IIB elements, particularly zinc (Zn) and cadmium (Cd). Examples of group-VI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions.

The semiconductor elements may comprise a dopant. As an example, for III-V compounds, the dopant may be selected from the group comprising a P-type group-II dopant, for example, magnesium (Mg), zinc (Zn), cadmium (Cd), or mercury (Hg), a P-type group-IV dopant, for example, carbon (C), or an N-type group-IV dopant, for example, silicon (Si), germanium (Ge), selenium (Se), sulfur (S), terbium (Tb), or tin (Sn).

The active layer is the layer from which most of the radiation delivered by the light-emitting diode is emitted. According to an example, the active layer may comprise confinement means, such as multiple quantum wells. It is for example formed of an alternation of GaN and InGaN layers having respective thicknesses from 5 to 20 nm (for example, 8 nm) and from 1 to 10 nm (for example, 2.5 nm). The GaN layers may for example be N- or P-type doped. According to another example, the active layer may comprise a single InGaN layer, for example having a thickness greater than 10 nm.

Figure 2:
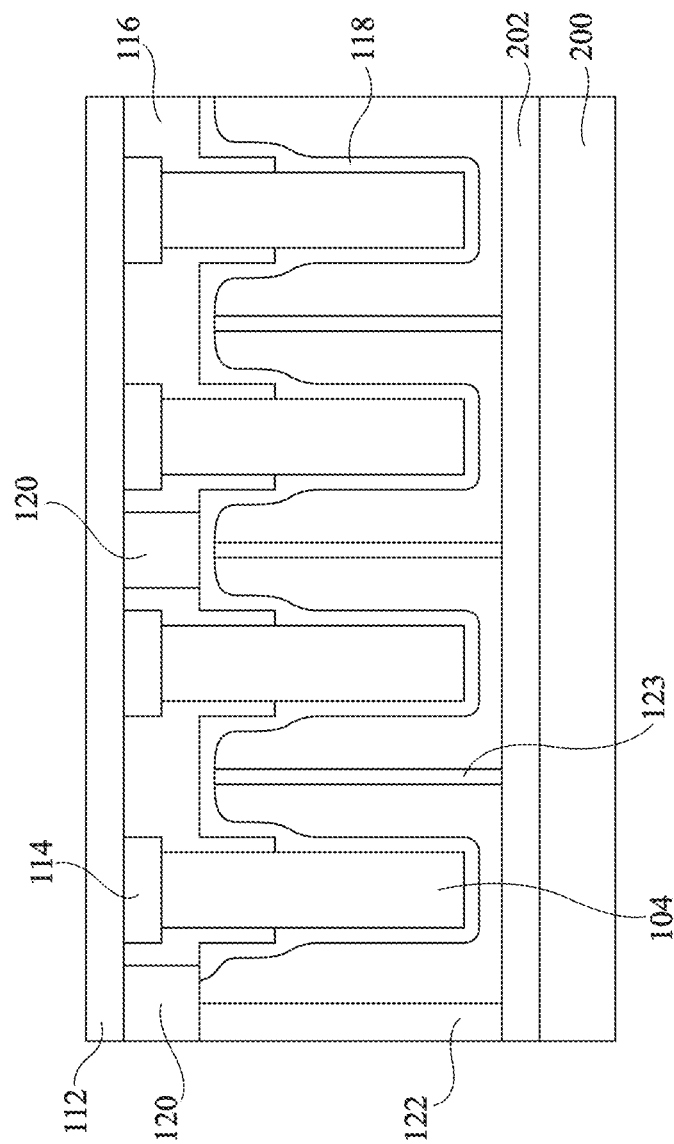
FIG. 2 is a partial simplified cross-section view illustrating the result of a step of manufacturing the optoelectronic device of FIG. 1.
Figure 3:
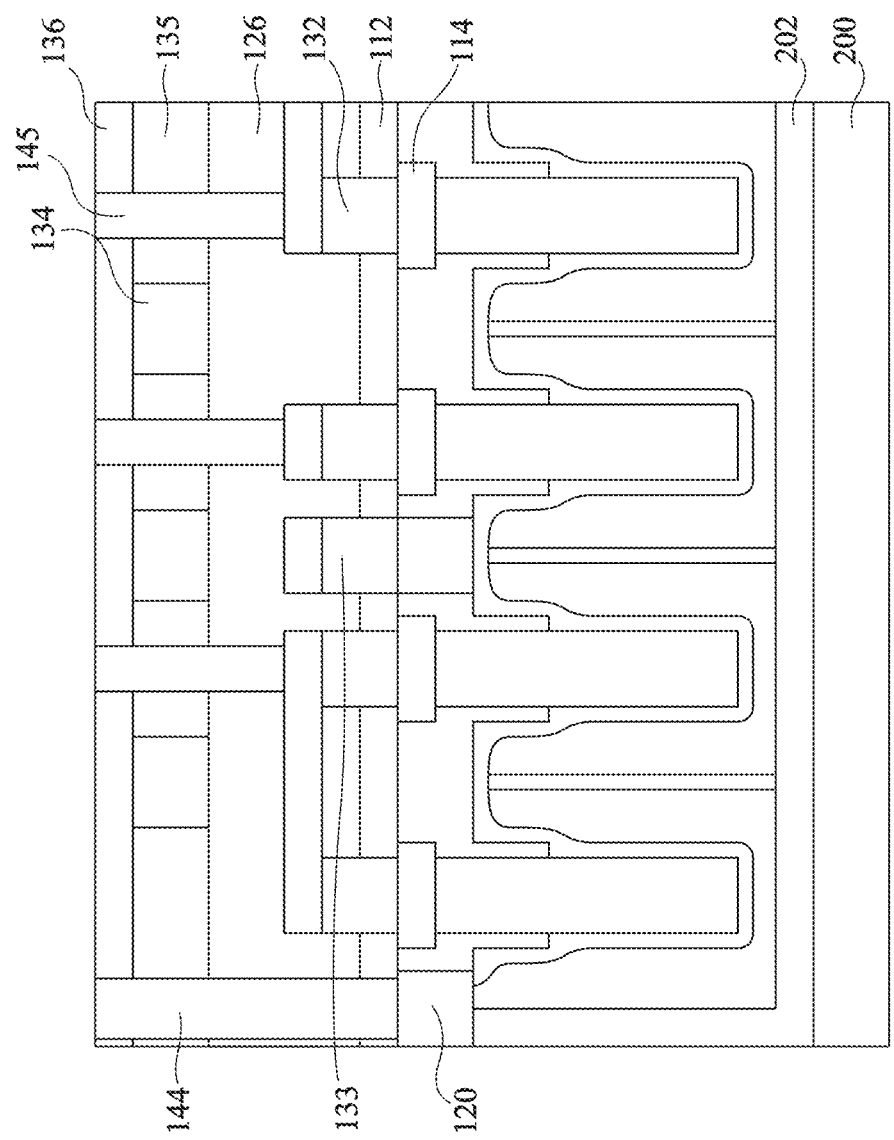
FIG. 3 is a partial simplified cross-section view illustrating the result of another step of manufacturing the optoelectronic device of FIG. 1.
Figure 4:
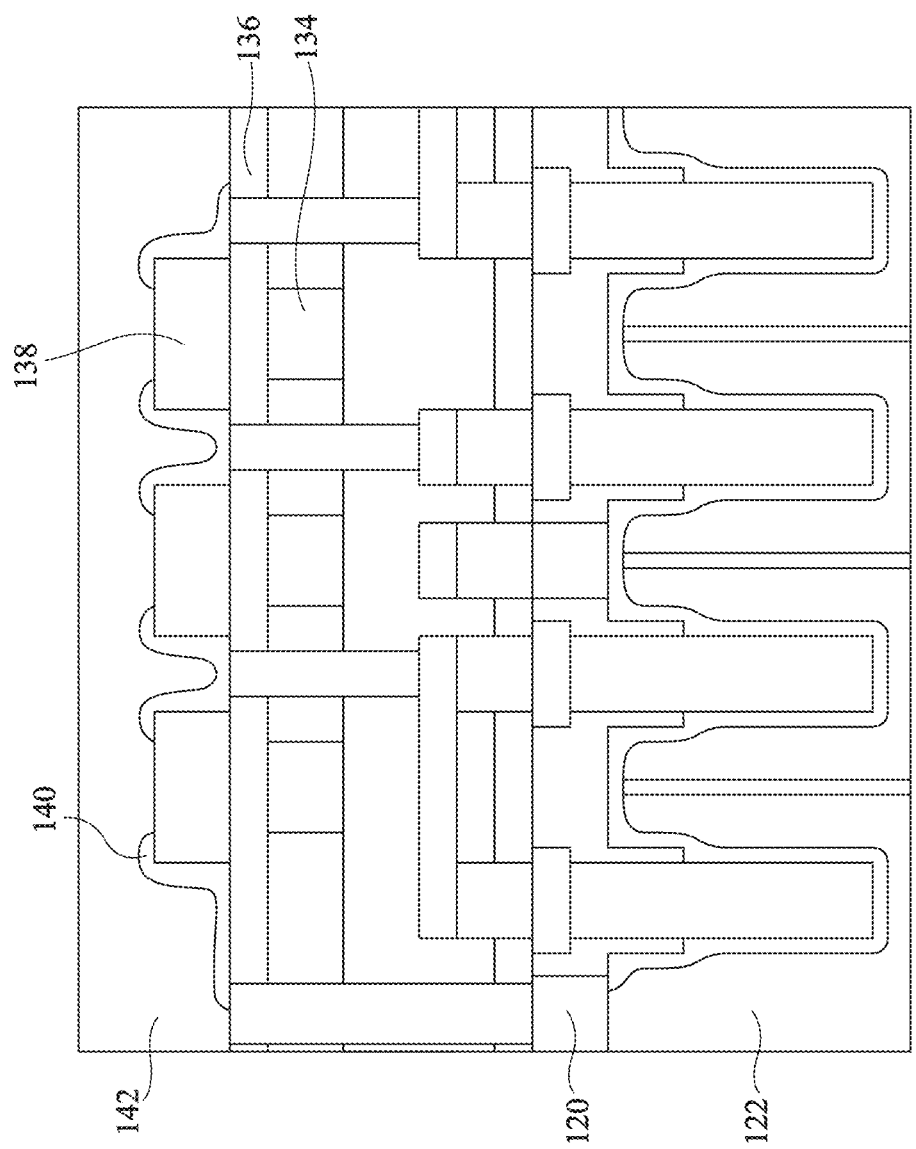
FIG. 4 is a partial simplified cross-section view illustrating the result of another step of manufacturing the optoelectronic device of FIG. 1.

FIGS. 2 to 4 are partial simplified cross-section views showing the results of successive steps of an example of an embodiment of a method of manufacturing the optoelectronic device 100 of FIG. 1.

FIG. 2 schematically shows the structure obtained after the steps comprising:

the forming of seed layer 112 on a semiconductor substrate, not shown;

the forming of seed pads 114 on seed layer 112 at the locations where light-emitting diodes 104 are desired to be formed;

the forming of a first portion of insulating layer 116 partially covering pads 114 and leaving the locations of light-emitting diodes 104 exposed;

the forming of light-emitting diodes 104 on pads 114 at the locations left exposed by the first portion of insulating layer 116;

the forming of the second portion of insulating layer 116 on the lower portion of light-emitting diodes 104;

the forming of pads 120 extending through layer 116 from layer 112;

the forming of conductive layer 118 on light-emitting diodes 104 and on insulating layer 116;

the forming of photoluminescent blocks 122 on conductive layer 118;

the forming of a handle 200, affixed to blocks 122, for example, by a bonding layer 202; and the removal of the substrate, not shown.

As a variation, a step of removing seed layer 112 and/or seed pads 114 may be added. For example, layer 112 may be removed at the same time as the substrate, not shown.

FIG. 3 schematically shows the structure obtained after the steps comprising:
- the forming on insulating layer 112 of stack 126, particularly conductive elements 128, having its conductive vias 132 crossing insulating layer 112;
- the forming of blocks 134, made of a conductive or semiconductor material, for example, of polysilicon, in contact with conductive elements 128;
- the forming of insulating regions 135 between blocks 134. The thickness of regions 135 is substantially equal to the thickness of blocks 134 and enables to leave the surface of each block 134 opposite to the surface in contact with conductive elements 128 exposed;
- the forming of insulating layer 136 on the exposed surfaces of blocks 134 and on regions 135;
- the forming of conductive vias 144 through insulating layers 136, 135, the insulating layers of stack 126, and insulating layer 112, to reach conductive pads 120 or 120a, a single via 144 being shown; and
- the forming of vias 145 through insulating layers 136, 135, and the insulating layers of stack 126.

FIG. 4 schematically shows the structure obtained after the steps comprising:
- the forming of semiconductor blocks 138 opposite blocks 134 on layer 136;
- the forming of conductive tracks 140 in contact with the drain and source areas of the different blocks 138; and
- the forming of insulating layer 142 on blocks 138, conductive tracks 140, and layer 136.

During a next step, certain photoluminescent blocks 122 may be etched to expose conductive pads 120a.

The steps of manufacturing transistors 110 are steps of manufacturing thin film transistors, for example, IGZO transistors. More particularly, these steps are carried out at a maximum temperature lower than 150° C. These steps are, in the present embodiment, performed in the reverse order with respect to the usual order of the steps of thin-film transistor manufacturing, that is, the gate is formed before the source and drain areas.

Figure 5:
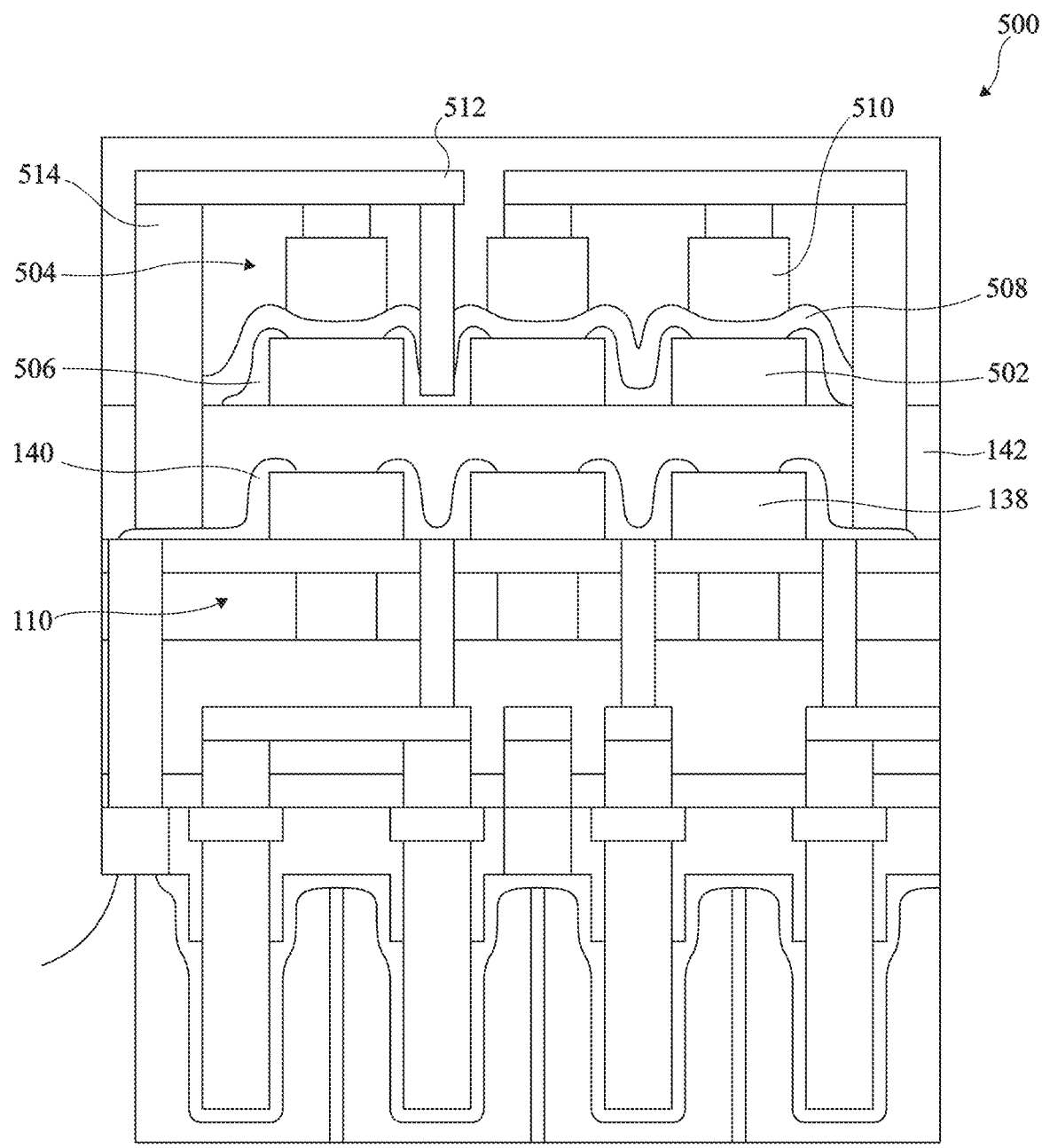
FIG. 5 is a partial simplified cross-section view of another embodiment of an optoelectronic device.

FIG. 5 schematically shows another embodiment of an optoelectronic device 500. Device 500 comprises all the elements of device 100 and further comprises an additional stage of thin film transistors 504, three transistors being shown, located on the stage comprising transistors 110. Device 500 thus comprises:
- semiconductor blocks 502 located on insulating layer 142. Blocks 502 comprise the source and drain areas of thin film transistors 504. Blocks 502 are similar to semiconductor blocks 138;
- conductive tracks 506, similar to conductive tracks 140, electrically connecting the source and drain areas of blocks 502 together. In the embodiment of FIG. 5, the three transistors are series-connected;
- an insulating layer 508 covering layer 142, conductive tracks 506, and blocks 502;
- conductive blocks 510 formed on layer 508, opposite conductive blocks 502. Blocks 510 form the gates of transistors 504, and the portions of layer 508 located between blocks 504 and 502 form the gate insulators; and
- a stack 512 of insulating layers, shown in FIG. 5 by a single block 512, covering transistors 504. Stack 512 further comprises conductive elements 514, for example, conductive tracks and conductive vias, located between and through the insulating layers of stack 512. Conductive elements 514 form an interconnection network. Conductive elements 514 for example connect some of blocks 510 and some of conductive layers 506 to conductive tracks 140. Conductive elements 514 thus partially cross insulating layer 512, insulating layer 508, and insulating layer 142 to reach conductive tracks 140.

Device 500 thus comprises two stages of thin film transistors. As a variation, the optoelectronic device may comprise more than two stages of thin film transistors. The presence of a plurality of transistor stages has the advantage of increasing the density of transistors.

As a variation, some of conductive elements 514 may connect conductive tracks 506 to conductive tracks 140.

Although, in the embodiment of FIG. 5, each transistor 504 is located opposite a transistor 110, the transistors of the different stages may be offset from one another and the transistor density may be different according to the considered stage.

Figure 6:
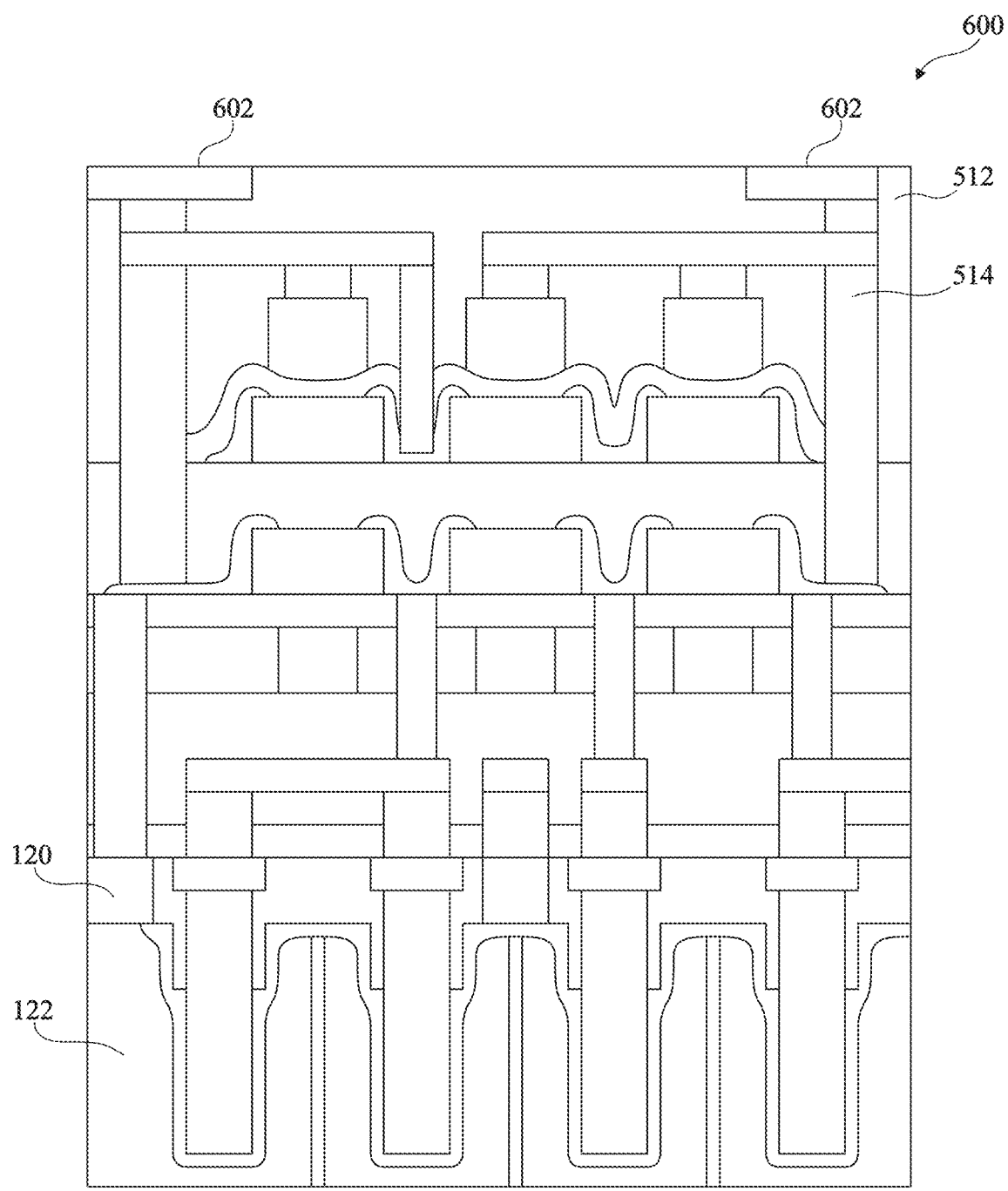
FIG. 6 is a partial simplified cross-section view of another embodiment of an optoelectronic device.

FIG. 6 schematically shows another embodiment of an optoelectronic device 600. Device 600 comprises all the elements of device 500, with the difference that device 600 does not comprise conductive pads 120a, that is, conductive pads which are not totally covered with a photoluminescent block 122, and that the electric connections between elements external to the integrated circuit are achieved by conductive pads 602 located at the level of the free surface of stack 512. Pads 602 are connected with the interconnection network of stack 512. It is thus possible to connect pads 602 to an external device, for example, to an external chip.

Figure 7:
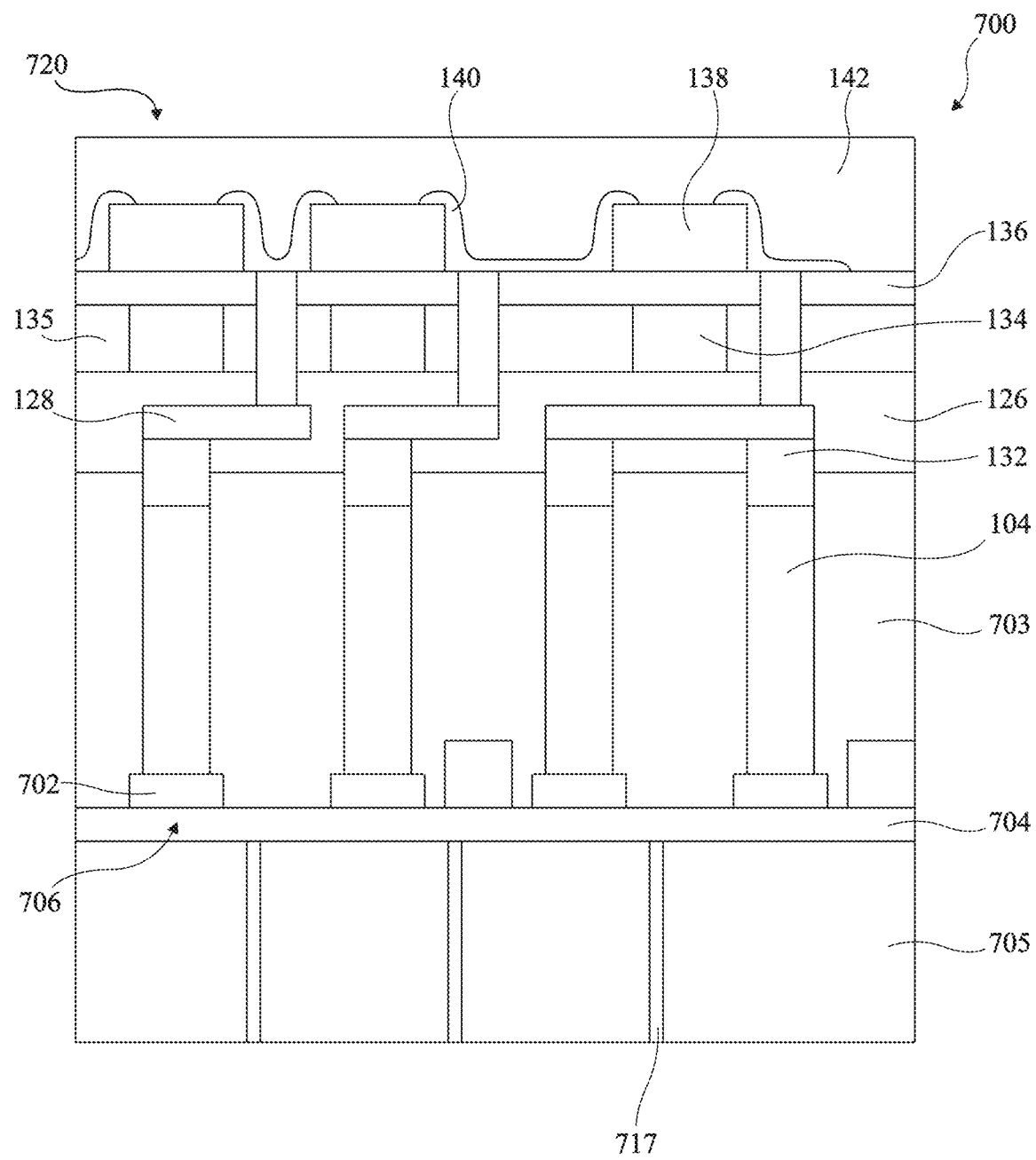
FIG. 7 is a partial simplified cross-section view of another embodiment of an optoelectronic device.

FIG. 7 schematically shows another embodiment of an optoelectronic device 700. Optoelectronic device 700 comprises light-emitting diodes 104, resting on seed pads 702 and surrounded with an insulating layer 703. Seed pads 702 are similar to the previously-described seed pads 114. Each pad 702 is at least partially transparent to the radiation emitted by the light-emitting diode formed on pad 702.

Seed pads 702 rest on a conductive layer 704. Layer 704 is preferably at least partially transparent to the radiations emitted by the light-emitting diode formed on pad 702. Pads 702 are in contact with layer 704 to form an electric connection. Layer 704 thus forms an electrode common to all the light-emitting diodes 104.

Layer 704 is covered with a plurality of photoluminescent blocks 705, photoluminescent blocks 705 being similar to the previously-described photoluminescent blocks 122. More particularly, each block 705 is located opposite a light-emitting diode 104. Further, blocks 705 are separated from one another by walls 707 similar to the previously-described walls 123.

The rest of device 700 is identical to device 100, with the difference that each light-emitting diode 104 is in contact, by the side opposite to seed pad 702, with a conductive element 132 of the interconnection network.

Thus, each light-emitting diode 104 may be controlled by a voltage applied between a first end, via a pad 702, and a second end, via a conductive element 132.

Conductive blocks 134 are formed on the stack of insulating layers 126. Each block 134 is in contact with a conductive element, not shown. Blocks 134 are surrounded with an insulating layer 135. The thickness of layer 135 is equal to the thickness of blocks 134. Each block 134 thus has a side non-covered with layer 135. Each block 134 forms the gate of a transistor 720.

Blocks 134 and insulating layer 135 are covered with an insulating layer 136. Semiconductor blocks 138 are located on layer 136, each block 138 being located opposite a block 134. Blocks 138 comprise the source and drain areas of transistors 720. Blocks 138 are further surrounded and covered with an insulating layer 142. Conductive elements 140, partially located on blocks 138, form connections between the source and drain areas of the different transistors 720. In the example of FIG. 7, the three shown transistors are series-connected. Transistors 720 are thin-film transistors, similar to transistors 110 and 504.

Figure 8:
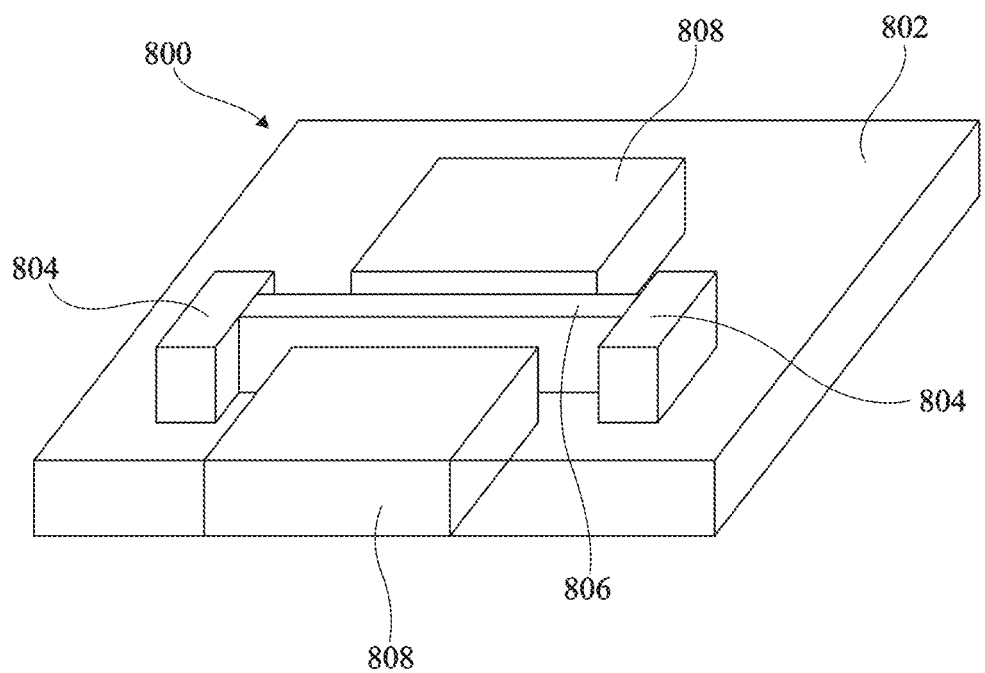
FIG. 8 schematically shows a portion of another embodiment of an optoelectronic device.

FIG. 8 schematically shows a portion of another embodiment of an optoelectronic device. More particularly, FIG. 8 shows a horizontal transistor 800. Transistor 800 is, like transistors 110, a thin film transistor (TFT). Horizontal transistor means a transistor having its different portions, for example, the source and drain areas, the gate, and the channel, at the same level, in a same layer, and preferably formed at the same time.

Thus, transistor 800 is formed in an insulating layer 802, for example, made of silicon oxide. Transistor 800 comprises, in layer 802:

two semiconductor blocks 804, forming the drain and source areas;

a semiconductor block 806 extending between, and being in contact with, blocks 804. Block 806 forms the channel of transistor 800; and blocks 800, made of a semiconductor or conductive material, located on either side of block 806 and forming the gate of transistor 800. Blocks 808 are separated from channel 806 by a region of layer 802.

Layer 802, comprising transistors 800, may replace the layers, for example, layers 135, 136, and 142, comprising transistors 110.

An advantage of the previously-described embodiments is that the manufacturing of the interconnection levels of stack 126 and of thin film transistors 110 has a thermal budget compatible with light-emitting diodes 104, that is, the manufacturing of transistors 110 may be performed on a structure already comprising light-emitting diodes 104 without negatively impacting the performance of light-emitting diodes 104.

Various embodiments and variations have been described. It will be understood by those skilled in the art that certain features of these various embodiments and variations may be combined, and other variations will occur to those skilled in the art. In particular, the embodiment of FIG. 7 may comprise, as described in relation with FIGS. 5 and 6, a plurality of thin-film transistor stages. Further, the embodiment of FIG. 7 may comprise, as described in relation with FIG. 6, conductive pads enabling to connect the optoelectronic device to external elements on the side of the transistors opposite to the light-emitting diodes.

Further, the electric connections may be arranged differently. Thus, as an example, at least some of the first ends of the light-emitting diodes may be connected to source or drain areas rather than to transistor gates.

Further, blocks 122 (respectively 705) and walls 123 (respectively 707) may be formed after the forming of the transistors.

Finally, the practical implementation of the described embodiments and variations is within the abilities of those skilled in the art based on the functional indications given hereabove.

The invention claimed is:

1. A method of manufacturing an optoelectronic device comprising the forming of an integrated circuit, comprising the step of:
   a. forming light-emitting diodes;
   b. forming a stack of electrically-insulating layers, said stack further comprising conductive elements between and through said insulating layers; and
   c. forming thin film transistors,
   d. said stack being located between the light-emitting diodes and the transistors, said conductive elements connecting at least some of the transistors to the light-emitting diodes;
   wherein steps a), b), and c) are successive, wherein, at step b), the stack is formed on the light-emitting diodes and wherein, at step c), the transistors are formed on the stack.

2. The method of claim 1, wherein each transistor comprises an electrically-conductive block forming the gate of the transistor, the electrically-conductive blocks being separated from one another by electrically-insulating regions.

3. The method of claim 1, wherein each transistor comprises a semiconductor block forming the drain, source, and channel areas of the transistor, the semiconductor blocks being separated from one another by electrically-insulating regions.

4. The method of claim 1, wherein the transistors are distributed in at least two stages of thin-film transistors.

5. The method of claim 4, wherein each stage comprises an insulating layer forming the gate insulator of all the transistors of this stage.

6. The method of claim 1, wherein, for each light-emitting diode, a first end of the light-emitting diode is connected to one of the conductive elements.

7. The method of claim 1, wherein, for at least one of the transistors, the source and drain regions and the gate of the transistor are located in a same insulating layer.

8. The method of claim 1, wherein step a) comprises forming wire-shaped, conical, or tapered semiconductor elements.

9. The method of claim 8, wherein step a) comprises growing semiconductor elements of the light-emitting diodes on conductive or semiconductor seed pads.

10. The method of claim 9, comprising a step of removing the seed pads.

11. The method of claim 1, wherein step c) comprises forming thin-film transistors distributed on at least two stages.

12. The method of claim 11, wherein each transistor comprises a gate and a semiconductor block forming the source and drain areas of the transistor, wherein, for the transistors of a first stage among said at least two stages, the gates of the transistors of the first stage are formed before the semiconductor blocks of the transistors of the first stage, and wherein, for the transistors of a second stage among said at least two stages, the gates of the transistors of the second stage are formed after the semiconductor blocks of the transistors of the second stage.

13. The method of claim 12, wherein the transistors of the first stage are closer to the light-emitting diodes than the transistors of the second stage.

14. The method of claim 1, wherein steps b) and c) are carried out at temperatures lower than 150° C.

* * * * *